(12) United States Patent
Leitgeb et al.

(10) Patent No.: US 10,887,977 B2
(45) Date of Patent: Jan. 5, 2021

(54) HYBRID COMPONENT CARRIER AND METHOD FOR MANUFACTURING THE SAME

(71) Applicant: AT&S Austria Technologie & Systemtechnik Aktiengesellschaft, Leoben (AT)

(72) Inventors: Markus Leitgeb, Trofaiach (AT); Heinz Moitzi, Zeltweg (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/440,757

(22) Filed: Jun. 13, 2019

(65) Prior Publication Data

US 2019/0297719 A1    Sep. 26, 2019

Related U.S. Application Data

(62) Division of application No. 15/914,842, filed on Mar. 7, 2018, now Pat. No. 10,383,208.

(30) Foreign Application Priority Data

Mar. 8, 2017   (EP) .................................... 17159924

(51) Int. Cl.
*H05K 1/02*   (2006.01)
*H05K 3/46*   (2006.01)
(Continued)

(52) U.S. Cl.
CPC ....... *H05K 1/0201* (2013.01); *H01L 21/4857* (2013.01); *H01L 23/5385* (2013.01);
(Continued)

(58) Field of Classification Search
CPC .. H05K 1/0201; H05K 1/0271; H05K 1/0298; H05K 3/0061; H05K 3/4038;
(Continued)

(56) References Cited

U.S. PATENT DOCUMENTS 5,281,151 A  *  1/1994  Arima ............... H01L 23/49822
                                                174/255
5,889,233 A  *  3/1999  Shimoto ........... H01L 23/49894
                                                174/250

(Continued)

OTHER PUBLICATIONS

Geoghegan, C.; Communication in Application No. 17 159 924.4; European Patent Office; pp. 1-7; Sep. 7, 2020; 2280 HV Rijswijk, Netherlands.

*Primary Examiner* — Timothy J Thompson
*Assistant Examiner* — Michael F McAllister
(74) *Attorney, Agent, or Firm* — Robert A. Blaha; Smith Tempel Blaha LLC (57) ABSTRACT

A method for manufacturing of a hybrid component carrier includes providing a first layer structure having at least one electrically insulating layer and at least one electrically conductive layer and forming a second layer structure on the first layer structure wherein the second layer structure has at least a first layer and a second layer. The first layer structure has a first density of electrically conductive elements. The second layer structure has a second density of electrically conductive elements. The second density of electrically conductive elements is greater than the first density of electrically conductive elements. The forming of the second layer structure on the first layer structure includes forming the first layer of the second layer structure on the first layer structure and subsequently forming the second layer of the second layer structure on the first layer of the second layer structure.

9 Claims, 6 Drawing Sheets

(51) Int. Cl.
*H01L 21/48* (2006.01)
*H01L 23/538* (2006.01)
*H05K 1/18* (2006.01)
*H05K 3/00* (2006.01)
*H05K 3/40* (2006.01)
*H05K 3/42* (2006.01)
*H05K 1/03* (2006.01)

(52) U.S. Cl.
CPC ......... *H05K 1/0271* (2013.01); *H05K 1/0298* (2013.01); *H05K 1/181* (2013.01); *H05K 3/0061* (2013.01); *H05K 3/4038* (2013.01); *H05K 3/429* (2013.01); *H05K 3/4608* (2013.01); *H05K 3/4614* (2013.01); *H05K 3/4644* (2013.01); *H05K 3/4688* (2013.01); *H05K 1/0366* (2013.01); *H05K 1/0373* (2013.01); *H05K 3/4611* (2013.01); *H05K 3/4632* (2013.01); *H05K 3/4673* (2013.01); *H05K 2201/0209* (2013.01); *H05K 2201/096* (2013.01)

(58) Field of Classification Search
CPC .... H05K 3/429; H05K 3/4608; H05K 3/4614; H05K 3/4644; H05K 3/4688; H05K 1/0366; H05K 1/0373; H05K 3/4611; H05K 3/4632; H05K 3/4673; H05K 2201/0209; H05K 201/096; H01L 21/4857; H01L 23/5385; H01L 1/181
USPC ....................................................... 174/250
See application file for complete search history.

(56) References Cited

U.S. PATENT DOCUMENTS

| | | | |
|---|---|---|---|
| 6,190,493 B1 | 2/2001 | Watanabe et al. | |
| 6,444,919 B1 | 9/2002 | Economikos et al. | |
| 6,680,529 B2* | 1/2004 | Chen | H01L 23/49822 257/700 |
| 6,734,542 B2* | 5/2004 | Nakatani | H01L 21/4857 257/687 |
| 6,831,357 B2* | 12/2004 | Nishitani | H01L 21/4857 257/697 |
| 7,394,663 B2* | 7/2008 | Yamashita | H01L 23/49894 257/E23.077 |
| 7,842,887 B2* | 11/2010 | Sakamoto | H01L 24/19 174/260 |
| 8,853,557 B2 | 10/2014 | Yugawa | |
| 9,098,646 B2 | 8/2015 | Bora et al. | |
| 9,190,380 B2* | 11/2015 | Teh | H01L 24/24 |
| 9,418,877 B2* | 8/2016 | Gu | H01L 24/81 |
| 9,437,569 B2* | 9/2016 | Teh | H01L 23/5389 |
| 9,516,740 B2* | 12/2016 | Lee | H05K 1/185 |
| 9,859,201 B2* | 1/2018 | Shimizu | H05K 1/0346 |
| 10,381,326 B2* | 8/2019 | Woychik | H01L 21/6835 |
| 2002/0117743 A1* | 8/2002 | Nakatani | H01L 23/5384 257/687 |
| 2004/0074865 A1 | 4/2004 | Ho et al. | |
| 2004/0132229 A1* | 7/2004 | Audet | H05K 1/0216 438/106 |
| 2004/0158980 A1* | 8/2004 | Nakatani | H01L 23/49816 29/852 |
| 2005/0112798 A1* | 5/2005 | Bjorbell | H01L 24/82 438/106 |
| 2008/0023821 A1 | 1/2008 | Hsu | |
| 2009/0224391 A1* | 9/2009 | Lin | H01L 24/73 257/690 |
| 2011/0056739 A1 | 3/2011 | Lee | |
| 2011/0127664 A1 | 6/2011 | Antesberger et al. | |
| 2011/0194265 A1* | 8/2011 | Su | H01L 23/5389 361/761 |
| 2011/0221054 A1 | 9/2011 | Lin et al. | |
| 2014/0186581 A1* | 7/2014 | Lee | H05K 3/381 428/141 |
| 2014/0347837 A1 | 11/2014 | Kariya et al. | |
| 2014/0376196 A1 | 12/2014 | Karpovych et al. | |
| 2015/0060124 A1 | 3/2015 | Terui et al. | |
| 2015/0084210 A1 | 3/2015 | Chiu et al. | |
| 2015/0092378 A1 | 4/2015 | Roy et al. | |
| 2015/0181710 A1 | 6/2015 | Rathburn | |
| 2015/0245473 A1 | 8/2015 | Shimizu et al. | |
| 2015/0282307 A1* | 10/2015 | Shimizu | H01L 23/5383 174/264 |
| 2015/0296616 A1* | 10/2015 | Jomaa | H05K 1/112 174/261 |
| 2015/0357276 A1* | 12/2015 | Shimizu | H05K 3/0023 361/783 |
| 2016/0381792 A1 | 12/2016 | Mok et al. | |
| 2017/0005044 A1* | 1/2017 | Ishido | H01L 21/4853 |
| 2017/0256482 A1* | 9/2017 | Furuichi | H01L 21/4857 |
| 2018/0145033 A1* | 5/2018 | Yi | H01L 23/49838 |

* cited by examiner

HYBRID COMPONENT CARRIER AND METHOD FOR MANUFACTURING THE SAME

CROSS-REFERENCE TO RELATED APPLICATIONS

This application is a divisional application from U.S. application Ser. No. 15/914,842, filed on Mar. 7, 2018, and claims the benefit of the filing date of the European Patent Application No. 17 159 924.4 filed Mar. 8, 2017, the disclosures of which are hereby incorporated herein by reference.

TECHNICAL FIELD

The invention relates to a hybrid component carrier and a method for manufacturing the same.

TECHNOLOGICAL BACKGROUND

It is known to combine a first layer structure with a lower density of electrically conductive elements, such as a printed circuit board (PCB), which may be a high density interconnect structure, with a second layer structure of higher density of electrically conductive elements, such as a substrate, which may be termed as a ultra-high density interconnect structure. In such approaches, the substrate and the PCB are manufactured separately. Only subsequently the substrate and the PCB are combined to yield the final component carrier.

Such conventional approaches may have several disadvantages as they require the use of the additional substrate or of an interposer. In the scenario of ultra-high integration density of electrically conductive elements as in a substrate, problems arise in that the component carriers, including the components mounted thereon are significantly heated during operation and are not capable of removing the generated heat in a sufficient manner. This results in reliability problems and the danger of overheating. Further, due to the sophisticated electronic functionality and a high integration density of electrically conductive elements and their thin layer architecture, the component carrier may not capable of removing the generated mechanical stress and tensions in a sufficient manner. In particular the additional substrate or interposer which may for instance be made from silicon may not be capable of efficiently dissipating mechanical stress and/or heat.

Further, the second layer structure needs to be connected to the first layer structure for instance by means of an adhesive layer. Common adhesive layers, however, are usually electrically insulating, therefore preventing a direct electrical contact between the first layer structure and the second layer structure. For establishing the electrical contact between the second layer structure and the first layer structure, further process steps are required rendering the manufacturing process less efficient.

Along with the development of electronic industries, electronic products have an ongoing trend towards miniaturization and high performance. Therefore, there may be a need to provide in particular reliable and robust high-performance component carriers having an excellent high frequency behavior and which can be manufactured with reasonable manufacturing effort.

SUMMARY

This need may be met by the subject matter according to the independent claims. Advantageous embodiments of the present invention are described by the dependent claims.

According to a first aspect of the invention, a method for manufacturing of a hybrid component carrier is described, which method includes providing a first layer structure having at least one electrically insulating layer and at least one electrically conductive layer; embedding a first component, in particular a passive component, in the first layer structure; and forming of a second layer structure on the first layer structure, wherein the second layer structure comprises at least a first layer and a second layer, wherein the first layer structure has a first density of electrically conductive elements and wherein the second layer structure has a second density of electrically conductive elements, wherein the second density of electrically conductive elements is greater than the first density of electrically conductive elements, and wherein the forming of the second layer structure on the first layer structure includes forming the first layer of the second layer structure on the first layer structure; and subsequently, forming the second layer of the second layer structure on the first layer of the second layer structure.

According to an alternative aspect of the invention, a component carrier includes a first layer structure having at least one electrically insulating layer and at least one electrically conductive layer, a first component, in particular a passive component, embedded in the first layer structure and a second layer structure on the first layer structure. In this alternative embodiment, the second layer structure has at least a first layer and a second layer. The first layer structure has a first density of electrically conductive elements. The second layer structure has a second density of electrically conductive elements. The second density of electrically conductive elements is greater than the first density of electrically conductive elements. The first layer of the second layer structure is formed on the first layer structure and the second layer of the second layer structure is formed on the first layer of the second layer structure.

OVERVIEW OF EMBODIMENTS

The term "forming of the second layer structure" on the first layer structure may optionally encompass embedding of the first layer structure entirely or partially within the first layer structure. For instance, the first layer of the second layer structure may be formed in a cavity of suitable dimensions within the first layer structure.

According to another aspect of the invention a component carrier as obtained by the method according to the invention is described.

Instead of manufacturing, according to conventional approaches, the first layer structure and the second layer structure separately followed by combining the first layer structure having a lower density of electronic elements and the second layer structure having a higher density of electronic elements, with the component carrier according to the present invention the first layer structure forms an integral connection to the second layer structure, and vice versa, by building up the second layer structure "layerwise" on the first layer structure. There is no need for using an additional substrate or interposer. Thereby, the method according to the invention allows for the manufacture of a highly compact, but at the same time reliable and robust high-performance component carrier having excellent high frequency behavior at reasonable manufacturing effort meeting the needs of an ongoing miniaturization of component carriers for use in modern electronic devices.

In the context of the present application, the term "conductive" means electrically conductive if nothing else is stated or otherwise apparent, while the term "insulating"

means electrically insulating if nothing else is stated or otherwise apparent. The insulating layer may be in the form of a dielectric layer.

According to another embodiment of the invention the first density of electrically conductive elements and the second density of electrically conductive elements is preferably defined by the number of electrical components per unit of volume.

In the context of the present application, an "electrically conductive element" is any type of separated part capable of conducting an electric current. More particular, an "electrically conductive element" is an element selected from the group consisting of electronic circuitry, microvias, electronic components, in particular active electronic components, elements for contacting electronic circuitry and/or electronic components, in particular solder deposits, copper pillars.

According to another embodiment, an "electrically conductive element" is an element selected from the group consisting of electronic circuitry and microvias.

For instance, the first layer structure has a lower total number of electronic circuitry and microvias than the second layer structure, wherein the first layer structure has the same volume as the second layer structure. The first layer structure would have in this embodiment a lower density of electrically conductive elements than the second layer structure. As another example it is assumed that a first layer structure has the same total number of electronic circuitry and microvias as a second layer structure, wherein the first layer structure has twice the volume as the second layer structure. In this example, the volume of the first layer structure is the height multiplied by the width multiplied by the length of the first layer structure. The volume of the second layer structure is the height multiplied by the width multiplied the length of the second layer structure. For instance, the height of the first layer structure may be about twice the height of the second layer structure, wherein the width of the first layer structure is about the same as the width of the second layer structure and the length of the first layer structure is about the same the length of the first layer structure. Then, if the same number of electrically conductive elements is present in the first layer structure and the second layer structure, the first layer structure would have in this embodiment a lower or smaller density of electrically conductive elements than the second layer structure due to the larger volume of the first layer structure.

According to another embodiment, an "electrically conductive element" is an element selected from the group consisting of electronic circuitry, microvias and electronic components, in particular active electronic components.

In particular, the first density of electrically conductive elements and the second density of electrically conductive elements is defined by the number of active components per unit of volume.

In particular, the first density of electrically conductive elements and the second density of electrically conductive elements is defined as a number or a volume of electrically conductive elements per unit of volume. It may also be possible to integrate electrically conductive elements of different sizes. Thus, a higher number of smaller electrically conductive elements may result in a higher density of electrically conductive elements than a lower number of larger electrically conductive elements.

The density of electrically conductive elements may be influenced or defined by a thickness of the electrically conductive element(s) and/or a size of an annular ring of a pad or a via which may form part of the electrically conductive elements. Furthermore, the density of the electrically conductive elements may be influenced or defined by a diameter of a via or a line-to-line distance (line space) of the electronic circuitry.

In a particular embodiment, the density of electrically conductive elements is defined by the mean line-to-line distance of the electronic circuitry. For instance, if the mean line-to-line distance of the first layer structure is twice the mean line-to-line distance of the electronic circuitry of the second layer structure, the second layer structure has a density of electrically conductive elements twice as large compared to that of the first layer structure.

In another embodiment, the density of electrically conductive elements is defined by the mean size of electronic components.

In particular, the density of electrically conductive elements may be defined by one or more of the group consisting of (a) a complexity of constitution; (b) a number, in particular the number per volume, of conductive layers; (c) an inverse of the thickness of the electrically conductive layers; (d) one or more materials; (e) a high frequency suitability; (f) an inverse of the mean diameter of (micro)vias; (g) a number, in particular the number per volume, of microvias; (h) a number of active components, in particular the number per volume; (i) a number, in particular the number per volume, of dies; (j) heat energy produced, in particular heat energy produced as joule heating by the electrically conductive elements, per unit of volume and per unit of time (k) an average line space of the electronic circuitry or the closest difference between two adjacent lines of electronic circuitry.

In a more general scenario, the density of electrically conductive elements may be defined by a complexity of constitution of the layer structure. A skilled person knows to differentiate between a more complex constitution of electrically conductive elements of a layer structure and a less complex constitution of the electrically conductive elements of a layer structure. A more complex constitution of electrically conductive elements may result in a higher performance, e.g. the signal transfer rate, for instance.

For instance, the inverse of the thickness of the electrically conductive layers is a suitable indicator for the density of electrically conductive elements. The smaller the thickness of the electrically conductive layers, i.e. the thinner the electrically conductive layers are, the more compact and densely packed the architecture of the layer structure becomes.

For instance, the inverse of the mean diameter of (micro) vias is a suitable indicator for the density of electrically conductive elements as well. The smaller the diameter of (micro)vias is the more compactly and more densely (micro) vias can be incorporated into the layer structure.

If the density of electrically conductive elements is defined by a number of conductive layers and the number of conductive layers of the second layer structure is greater than the density of conductive layers of the first layer structure, the second density of electrically conductive elements is greater than the first density of electrically conductive elements.

Since the current flowing through electrically conductive elements results in the generation of heat in particular in the form a joule heating, the greater the density of electrically conductive elements is, the more heat is generated. Hence, the heat energy produced per unit of volume and per unit of time is a suitable indicator for the density of electrically conductive elements.

Further, the density of electrically conductive elements is defined by an average line space of the electronic circuitry.

The greater density of electrically conductive elements is, the smaller the line space of the electronic circuitry becomes. In particular, the average line space of the electronic circuitry of the second layer structure is not more than 10 micrometer, whereas the average line space of the electronic circuitry of the first layer structure is at least 10 micrometer.

For instance, if the density of electrically conductive elements being defined by a number of conductive layers and the number of conductive layers of the second layer structure is greater than the density of conductive layers of the first layer structure, the second density of electrically conductive elements is greater than the first density of electrically conductive elements.

In particular, the second density of electrically conductive elements of the second electrically conductive layer is two times, more in particular three times, more in particular four times, more in particular five times greater than the first density of electrically conductive elements of the first layer structure.

In the context of the present application, an "electrically conductive layer" in particular means a structured electrically conductive layer, wherein structured electrical conductive layers in turn means comprising at least one of the group consisting of electrically conductive pathways, electronic circuitry and islands of electrically conductive material.

In the context of the present application, a "layer structure" in particular has at least one electrically insulating layer and at least one electrically conductive layer. More in particular, the term "layer structure" denotes a plurality of conductive layers and insulating layers particularly in an alternating arrangement, i.e. preferably a stack of alternating conductive layers and insulating layers.

In the context of the present application, the term "on" is in particular used to describe something at least partially covering something else by establishing a direct contact. In contrast, "above" is used to describe something, at least partially covering something else not necessarily establishing a direct contact. Stated differently, when "above" is in particular used for describing the spatial relationship between two layers, there may be other or additional layers placed between these two elements. For instance, in the context of the present application, the expression "a first layer of the second layer structure is formed on the first layer structure", means that the first layer of the second layer structure is formed directly on the first layer structure without any other layers formed or placed between the first layer of the second layer structure and the first layer structure. In contrast, the expression "a first layer of the second layer structure is formed above the first layer structure" means that the first layer of the second layer structure is not necessarily formed directly on the first layer structure but rather other layers may be formed or placed between the first layer of the second layer structure and the first layer structure.

In another embodiment, the method further comprises forming a third layer structure on a second main surface of the first layer structure, which second main surface is opposite to a first main surface, which first main surface the second layer structure is formed on. The third layer structure comprises at least a first layer and a second layer, wherein the third layer structure has a third density of electrically conductive elements, wherein the third density of electrically conductive elements is greater than the first density of electrically conductive elements. The forming of the third layer structure on the second main surface of the first layer structure in particular comprises: forming the first layer of the third layer structure on the second main surface of the first layer structure; and subsequently, forming the second layer of the third layer structure on the first layer of the third layer structure.

In particular, the first layer structure may comprise a core layer of a dielectric or insulating material, a first upper layer being an upper conductive layer and a first lower layer being a lower conductive layer sandwiching the core layer. More in particular, a second upper layer being an upper insulating layer is arranged above the upper conductive layer and a second lower layer being a lower insulating layer arranged below the lower conductive layer.

In particular, the core layer is at least twice as thick as at least one of both chosen from the first upper layer and the first lower layer. More in particular, the core layer is at least twice as thick as both, the first upper layer and the first lower layer.

Preferably, the core layer is at least twice as thick as at least one of both chosen from the second upper layer and the second lower layer. More preferably, the core layer is at least twice as thick as both, the second upper layer and the second lower layer.

More in particular, the core layer is at least twice as thick as each of the first upper layer, the first lower layer, the second upper layer and the second lower layer.

The use of a core layer having a thickness in such a range may be particularly advantageous, since such a thickness may enable a sufficient rigidity or stiffness of the component carrier. Further, the use of such a core layer enables an embedding of additional structures, elements and/or components, such as a heat dissipation pathway in the core layer.

In particular, there is at least one via passing from the upper conductive layer to the lower conductive layer through the insulating core layer. The via may be used as an electrical and/or thermally conductive pathway.

Alternatively, the first layer structure may comprise a core layer of a conductive metal, an upper dielectric layer and a lower dielectric layer sandwiching the core layer; an upper conductive layer arranged above the upper dielectric layer and a lower conductive layer arranged below the lower dielectric layer.

According to another embodiment of the invention, the second layer structure has a mean line-to-line distance of the electronic circuitry of not more than 20 micrometer, more preferably of not more than 10 micrometer, more preferably of not more than 5 micrometer and even more preferably of not more than 2 micrometer. The first layer structure may have a mean line-to-line distance of the electronic circuitry of at least 10 micrometer or at least 20 micrometer. The first layer structure may therefore be designated as a high-density-interconnect structure while the second layer structure may be designated as an ultra-high-density interconnect structure.

In the context of the present application, the term "high-density-interconnect structure" may particularly denote a structure which may have a smaller number of electrically conductive elements per unit of volume than an ultra-high-density interconnect structure. The first density layer structure may also denote a structure which may comprise relatively big electrically conductive elements such that a low number of such electrically conductive elements may be incorporated in one unit of volume.

In the context of the present application, the term "ultra-high-density interconnect structure" may particularly denote a structure which may have a larger number of electrically conductive elements per unit of volume than a high-density layer structure. The ultra-high-density layer structure may also denote a structure which may comprise relatively small electrically conductive elements such that a high number of such electrically conductive elements may be incorporated in one unit of volume.

According to another embodiment of the invention the first layer of the second layer structure formed on the first layer structure is an electrically insulating layer.

According to another embodiment of the invention, the first layer of the second layer structure and/or the second layer of the second layer structure are initially provided as an uncured electrically insulating material.

In the context of the present application, in particular an electrically insulating material is a "pre-preg". A pre-preg is a "pre-impregnated" composite fibers material comprising a thermoset polymer matrix material, such as an epoxy.

In the context of the present application, the term "most upper layer of the first layer structure" designates the layer of the first layer structure which the first layer of the second layer structure is placed on or present on. Further, in the context of the present application, the term "second most upper layer of the first layer structure" is the layer of the first layer structure which the "most upper layer of the first layer structure" of the first layer structure is placed on or present on.

In particular, the most upper layer of the first layer structure is an electrically conductive layer. The first layer of the second layer structure formed on this most upper layer of the first layer structure is in particular an electrical insulating layer. For forming the first layer of the second layer structure on the first layer structure, the first layer of the second layer structure is preferably initially provided as an uncured solid electrically insulating material. The first layer of the second layer structure is placed on the most upper layer of the first layer structure. The curing step may be performed afterwards by applying pressure and/or heat. By the curing step the first layer of the second layer structure is connected to the first layer structure, in particular to the insulating layer which is placed directly under most upper conductive layer. Since the most upper layer of the first layer structure is usually a structured conductive layer of electronic circuitry, a contact between the first layer of the second layer structure and the insulating layer below the most upper conductive layer of the first layer structure, i.e. the second upper insulating layer, can be formed through the structured conductive surface of the most upper layer of the first layer structure. Hence, the first layer of the second layer structure may form an integral connection, in particular a chemical bond to the insulating second most upper layer of the first layer structure which is below the most upper conductive layer of the first layer structure. In this way, the first layer and the second layer can be advantageously connected to each other without an adhesive layer or adhesive agent.

In particular, if the most upper layer of the first layer structure is an electrically insulating layer, the first layer of the second layer structure is in particular an electrically conductive layer and in particular the second layer of the second layer structure is an electrical insulating layer, which can be connected to the first layer structure by a curing process, which in particular is done by applying heat and/or pressure.

According to another embodiment of the invention, the second layer structure is formed on the first layer structure so as to fully cover the upper surface of the first layer structure. Preferably at least the first layer of the second layer structure is formed on the first layer structure so as to fully cover the upper surface of the first layer structure. The expression "fully cover the upper surface" means covering of the upper surface to a degree of at least 70%, particularly 80%, more particularly 90% and more particularly at least 95%.

The advantages of both layer structures, i.e. the first layer structure providing suitable stiffness and robustness, and the second layer structure enabling a maximum integration density and performance, are thereby exploited in an optimal way.

According to another embodiment of the invention, the first layer of the second layer structure and/or the second layer of the second layer structure comprises reinforcing particles, in particular reinforcing spheres, more in particular reinforcing glass-spheres.

In particular, the first layer of the second layer structure and/or the second layer of the second layer structure comprises reinforcing particles, in particular reinforcing spheres, more in particular reinforcing glass-spheres, at least in an amount of 1 wt-%, in particular 10 wt-%, more in particular 20 wt-%, more in particular 40 wt-% and more in particular at least 70 wt-%.

In a preferred embodiment the total amount of glass is about 60 wt-% in the first layer structure and about 70 wt-% in the second layer structure, wherein the glass in the first layer structure is preferably in the form of glass fibers and the glass in the second layer structure is preferably in the form of glass spheres.

In electrical circuits, a parasitic capacitance, or a stray capacitance is an unwanted capacitance that exists between the parts of an electronic component or circuit due to their close proximity to each other. In particular, the use of compact, relatively thin layers and the high density of electrically conductive elements in the second layer structure may result in such parasitic capacitance. At low frequencies parasitic capacitance can usually be ignored, but in high frequency circuits, as relevant for component carriers, it can be a major problem. In particular, at frequencies of about 24 GHz and more, as usually relevant for modern component carrier applications, parasitic capacitance can usually not be ignored anymore. Further, at high frequencies a skin effect which describes the tendency of an alternating electric current to become distributed within a conductor such that the current density is largest near the surface of the conductor, becomes relevant. The electric current then flows mainly at the "skin" of the conductor resulting in an unwanted increase of the electrical resistance in the conductor. The effects mentioned above may constitute a problem when using high frequencies, as already mentioned, and/or in particular in high speed applications, with data transfer rates of in particular about or more than 10 Gigabits/second. This requires materials with an DF (dissipation factor) of not more than 0.004, more preferably of not more than 0.002.

Advantageously by forming a first layer of the second layer structure and/or the second layer of the second layer structure of a material comprising reinforcing particles, in particular reinforcing spheres, more in particular reinforcing glass-spheres the presence or the formation of the above described negative effects may by advantageously reduced. In contrast to a glass fabric with reinforcing fibers, the glass particles provide a more suitable dielectric constant as required in particular for high speed applications and therefore are particularly suitable for being used in the second layer structure, i.e. the ultra-high-density layer structure. Further, the glass particles allow establishing a very smooth surface for electroless copper deposition.

In particular the first layer of the second layer structure and/or the second layer of the second layer structure comprises a resin with reinforcing particles, in particular reinforcing spheres, more in particular reinforcing glass-spheres.

The reinforcing particles, in particular the reinforcing spheres, have preferably a diameter of not more than 1 micrometer.

In another embodiment, the reinforcing particles, in particular the reinforcing spheres, have preferably an average diameter within a range of approximately 0.07 micrometer and approximately 0.13 micrometer, more preferably of approximately 0.1 micrometer.

In particular, the use of an insulating material with reinforcing particles, in particular reinforcing spheres, more in particular reinforcing glass-spheres instead of a reinforcing mesh or fabric allows for an excellent high frequency behavior of the second layer structure.

In particular, none of the insulating layers of the first layer structure comprises reinforcing particles, in particular reinforcing spheres, more in particular reinforcing glass-spheres.

In particular, all of the insulating layers of the second layer structure comprise reinforcing particles, in particular reinforcing spheres, more in particular reinforcing glass-spheres.

In particular, all of the insulating layers of the first layer structure comprise a resin with a reinforcing mesh or a fabric of glass fibers, more in particular an FR material.

In particular, none of the insulating layers of the second layer structure comprises a resin with a reinforcing mesh of glass fibers, in particular an FR material.

In particular, the second most upper layer of the first layer structure is an electrically insulating layer, more in particular comprising a resin with a reinforcing mesh, more in particular an FR material, and, further, the most upper layer of the first layer structure is an electrically conductive layer and, further, the first layer of the second layer structure is an electrically insulating layer, more in particular comprising a resin with reinforcing particles, in particular reinforcing spheres, more in particular reinforcing glass-spheres. In particular, a passive electronic component is present on or embedded in the second most upper layer of the first layer structure and an active component is present on or embedded in the first layer of the second layer structure.

In the context of the present invention the term "embedded in" may define an electronic component which is present in a cavity or recess in one layer or in a plurality of layers of an electrically insulating material. In contrast, the term "mounted on" may define an electronic component not placed in a cavity or recess but placed on a planar surface portion of an insulating layer, preferably on a most upper insulating layer.

In a particular embodiment, the term "embedded in" may define an electronic component in a cavity or recess, wherein the cavity is present in one or in a plurality of insulating layers and is open on one side of the component carrier. For instance, the cavity may be present in the most upper of a plurality of insulating layers, preferably of the second layer structure, with the electronic component being present therein. Stated differently, the component is not covered with a further insulating layer but exposed on one side. This architecture provides the advantage of easy accessibility and implementation of the component into the component carrier.

In another particular embodiment, the term being "embedded in" may define an electronic component which is present in a cavity, wherein the cavity is closed on all sides. Stated differently, the component is covered by an insulating material on all sides. Such an architecture may for instance be obtained by cutting out an area from a first insulating layer thereby forming a recess which has an opening on one side, e.g. a top side, and then placing a second insulating layer on top of the first insulating layer in order to close the opening in the first layer. This architecture provides the advantage of protection and mechanical stability for the component.

According to another embodiment of the invention, the at least one electrically insulating layer of the first layer structure comprise glass-fibers, preferably being an FR material.

In particular at least one of the electrically insulating layer of the first layer structure, preferably the core layer, comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon®), a ceramic, and a metal oxide. Reinforcing materials such as webs, fibers or spheres, for example made of glass (multilayer glass) may be used as well. Teflon® is a registered mark of the Chemours Company FC, of Wilmington, Del., U.S.A. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer.

In particular, at least one of the electrically insulating layer of the first layer structure comprises glass fibers at least in an amount of 1 wt-%, in particular 10 wt-%, more in particular 20 wt-%, more in particular 40 wt-% and more in particular 60 wt-%.

According to another embodiment of the invention, the method further comprises a curing step of at least the first layer of the second layer structure and/or of the second layer of the second layer structure for directly binding the first layer of the second layer structure and/or the second layer of the second layer structure to the first layer structure, preferably to an exposed electrically insulating layer of the first layer structure.

Thereby, bonds, preferably chemical bonds, may be formed between the first layer structure and the second layer structure, integrally connecting said layer structures. By such bonds formed between the first layer structure and the second layer structure integrally connecting said layer structures, generated mechanical stress and tensions in the second layer structure are suitably coupled to the first layer structure and thereby compensated by the robust architecture of the first layer structure. In addition, due to the integral connection of first layer structure and the second layer structure, heat generated by high performance components in the second layer structure maybe more suitably dissipated from the second layer structure into the first layer structure.

According to another embodiment of the invention the first layer of the second layer structure has a thickness of not more than approximately 50 micrometer, particularly not more than approximately 40 micrometer, more particularly not more than approximately 30 micrometer, more particularly not more than approximately 20 micrometer, more particularly not more than approximately 15 micrometer, more particularly not more than approximately 10 micrometer.

In particular, the second layer of the second layer structure has a thickness of not more than approximately 50 micrometer, particularly not more than approximately 40 micrometer, more particularly not more than approximately 30 micrometer, more particularly not more than 20 micrometer, more particularly not more than approximately 15 micrometer, more particularly not more than approximately 8 micrometer.

In particular, the first layer of the second layer structure is an insulating layer having a thickness of not more than approximately 40 micrometer, in particular of not more than approximately 30 micrometer, and the second layer of the second layer structure is a conductive layer having a thickness of not more than approximately 20 micrometer, in particular of not more than approximately 15 micrometer.

In particular, all layers of the second layer structure, which are electrically insulating layers, have a thickness of not more than 40 micrometer, in particular of not more than approximately 30 micrometer.

In particular, all layers of the second layer structure, which are electrically conductive layers, have a thickness of not more than approximately 20 micrometer, in particular of not more than approximately 15 micrometer and more particularly not more than approximately 3 micrometer.

In particular, all layers of the first layer structure, which are electrically insulating layers, have a thickness of more than approximately 30 micrometer, in particular of more than approximately 40 micrometer.

In particular, all layers of the first layer structure, which are electrically conductive layers, have a thickness of more than approximately 20 micrometer, in particular of more than approximately 15 micrometer.

All layers of the first layer structure, which are electrically insulating layers, have a thickness of more than approximately 40 micrometer, all layers of the first layer structure, which are electrically conductive layers, have a thickness of more than approximately 20 micrometer, all layers of the second layer structure, which are electrically insulating layers, have a thickness of not more than approximately 30 micrometer, all layers of the second layer structure, which are electrically conductive layers, have a thickness of not more than approximately 15 micrometer.

In particular, the first layer of the second layer structure is an electrically insulating layer having a thickness smaller than the thickness of the one of the at least one insulating layer of the first layer structure, which has the smallest thickness.

In particular, the second layer of the second layer structure is an electrically insulating layer having a thickness smaller than the thickness of the one of the at least one insulating layer of the first layer structure, which has the smallest thickness.

In particular, the first layer of the second layer structure is an electrically conductive layer having a thickness smaller than the thickness of the one of the at least one electrically conductive layer of the first layer structure, which has the smallest thickness.

In particular, the second layer of the second layer structure is an electrically conductive layer having a thickness smaller than the thickness of the one of the at least one electrically conductive layer of the first layer structure, which has the smallest thickness.

Providing a first layer structure comprising layers having a relatively large thickness and providing a second layer structure comprising layers having a relatively small thickness allows for the manufacture of a component carrier which is on the one hand reliable and robust while on the other hand allow for a high performance with excellent high frequency behavior.

In particular, at least the first layer of the second layer structure is an insulating layer having a thickness of not more than approximately 40 micrometer, in particular of not more than approximately 30 micrometer, and at least the second layer of the second layer structure is a conductive layer having a thickness of not more than approximately 20 micrometer, in particular of not more than approximately 15 micrometer and at least the first layer of the second layer structure is of a material comprising reinforcing particles, in particular reinforcing spheres, more in particular reinforcing glass-spheres. Thereby a highly integrated component carrier may be provided while the presence or the formation of unwanted parasitic capacitances may by advantageously reduced.

In particular the first layer of the second layer structure and/or the second layer of the second layer structure comprises a resin with reinforcing particles, in particular reinforcing spheres, more in particular reinforcing glass-spheres.

According to another embodiment of the invention the method further comprises forming of at least one electrical connection via between the first layer of the second layer structure and/or the second layer of the second layer structure and at least one of the electrically conductive layers of the first layer structure.

The component carrier according to the invention may comprise a plurality of vias or microvias. Each via consists of two pads in corresponding positions on different conductive layers of the component carrier. The different conductive layers of the component carrier are electrically connected by providing a corresponding hole. The hole is made conductive for instance by electroplating, or is lined.

The vias are preferably microvias. Microvias may be of different types. As a first type, blind vias are exposed only on one side of the board. As a second type, buried vias connect internal layers without being exposed on either surface.

Thermal vias carry heat away from power devices and may be used in arrays thereby forming a thermal pathway for dissipating thermal energy, in particular from the second layer structure into heat resistant regions of the component carrier, in particular into the first layer structure, and/or into the surroundings.

According to another embodiment of the invention, the method further comprises forming a cavity in the second layer structure; and providing a second component, in particular an active component, in the cavity; wherein in particular the first component is embedded in the second most upper layer of the first layer structure and the second component is embedded in the first layer of the second layer structure.

In particular, the cavity or recess is formed in an insulating layer of the second layer structure. In particular, the cavity or a recess is formed after the prepeg has placed and cured.

In particular, an adhesion-preventing material or anti-adhesion material or nonstick material is used for the removal of a part or sub-portion of an insulating layer for forming the cavity or recess. In particular, the anti-adhesion is placed, before an insulating layer is formed thereupon.

Subsequently, a part or a sub-portion of the insulating layer may be removed, which part or sub-portion corresponds to the area where the anti-adhesion material had been placed. In order to enable a simple and reliable processing of the adhesion-preventing material or anti adhesion, the anti-adhesion material comprises a separation component, a binder and a solvent. The separation component ensures that an adhesion in the region of the sub-portion to be subsequently removed, between the layers to be bonded will be reliably prevented. The binder, in particular, serves to fix the anti-adhesion material to the support, or one of the layers to be bonded, during the bonding procedure and adjust a rheology which will enable a perfect and problem-free application. The solvent serves to enable the simple and reliable processing of the anti-adhesion material.

Alternatively, at least one cavity or recess may be already contained in the prepeg before the prepeg is used for building up an insulating layer of the second layer structure.

A component such as the second component which preferably is an active component may be placed in the cavity or recess formed. The electronic components which perform a core electronic function like amplification, electronic switching, electronic controlling and acting upon a source of current are active components. In particular an active component within the meaning of the invention is at least one from the group including an electronic chip, in particular naked dies or bare dies, a storage device (for instance a DRAM or another data memory), an integrated circuit, a signal processing component, a sensor.

In particular, the cavity or recess is formed in the first layer or the second layer of the second layer structure and the cavity or a recess is formed after the prepeg has placed and cured and a component. In particular the active component which is placed into the cavity or recess is a chip package.

An additional package encapsulating the chip is usually provided to sufficiently protect the chip in conventional printed circuit boards with an additional substrate. In the present highly integrated component carrier an additional package encapsulating the chip is not required since the chip is embedded directly into an insulating layer of the second layer structure without an additional substrate. Stated differently, the insulating material of the insulating layer itself serves as package or molding encapsulating the chip which renders the provision of an additional package obsolete thereby making the component carrier more compact and its manufacture more efficient since the additional step of package formation can be spared.

In particular, the active components are placed on or embedded in the second layer structure by means of at least one of the group containing solder deposits and copper pillars.

According to another embodiment of the invention, the method further comprises providing at least one heat dissipation pathway for dissipating heat from the second layer structure to the first layer structure.

The thermal heat dissipation pathway may be formed by structures of thermally conductive materials leading from the second layer structure to the first layer structure. In particular the first layer structure may serve as a heat dissipation pathway. From the first layer structure the heat may further be led or conducted out of the component carrier by means of the heat dissipation pathway provided by thermally conductive structures and heat conductive elements.

The first layer structure preferably being a high-density interconnect structure has a first density of electrically conductive elements and the second layer structure has a second density of electrically conductive elements, preferably being an ultra-high-density interconnect structure with the second density of electrically conductive elements being greater than the first density of electrically conductive elements. Therefore, the components mounted on and/or embedded in the second layer structure are significantly heated during operation and are not capable of removing the generated heat in a sufficient manner. The second layer structure can be considered as a heat source. The heat may be produced by the flow of an electric current through the electronic elements, i.e. by joule heating (ohmic heating/resistive heating). Hence, the presence of a greater density of electrically conductive elements of the second layer structure relative to the first density of electrically conductive elements of the first layer structure results in more heat per unit of time and unit of volume being produced in the second layer. The first layer structure preferably may have incorporated therein additional heat absorbing elements or structures as well as heat conducting elements, which may serve as a heat dissipation pathway. Providing a thermal heat dissipation pathway leading from the second layer structure to the first layer structure allows for taking advantage of the different thermal properties and behavior of the first layer structure and the second layer enabling a dissipation of heat from the second layer structure to the first layer structure and then out of the component carrier.

According to another embodiment of the invention, the first layer structure provided has a first thickness; the second layer structure formed on the first layer structure has a second thickness, and the first thickness is larger than the second thickness.

Particularly, the first thickness is larger than the second thickness.

More particularly, the method further comprises providing at least one heat dissipation pathway for dissipating heat from the second layer structure to the first layer structure.

Providing a thermal heat dissipation pathway leading from the thinner second layer structure to the thicker first layer structure allows for taking advantage of the different thermal properties and behavior of the first layer structure and the second layer enabling a dissipation of heat from the second layer structure to the first layer structure for instance. For instance, it might be taken advantage of the larger thickness of the first layer structure by incorporating therein one or more heat dissipation pathways.

According to another embodiment of the invention, the component carrier further comprises a component, in particular an electronic component mounted on and/or embedded in at least one electrically insulating layer and/or at least one electrically conductive layer.

The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

According to another embodiment of the invention at least one component can be selected from a group consisting of an electrically non-conductive inlay, an electrically conductive inlay (such as a metal inlay, preferably comprising copper or aluminum), a heat transfer unit (for example a heat pipe), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a further component carrier, for example in a board-in-board configuration.

According to another embodiment, at least one electrically conductive layer comprises at least one of the group consisting of copper, aluminum, nickel, silver, gold, palladium, and tungsten. Although copper is usually preferred, other materials or coated versions thereof are possible as well, in particular coated with supra-conductive material such as graphene.

In particular, at least one electrically conductive layer of the second layer structure, in particular the second layer of the second layer structure, is build up on an insulating layer of the second layer structure, in particular the first layer of the second layer structure, by a semi-additive process forming electronic copper circuitry with contours having more steeply slanting sidewalls relative to the electronic copper circuitry of at least one of the electrically conductive layers of the first layer structure. Thereby, in particular, frequencies of about 24 GHz and more, as usually relevant for modern component carrier applications, can be employed.

According to another embodiment of the invention, the component carrier is shaped as a plate. This contributes to the compact design, wherein the component carrier nevertheless provides a large basis for mounting components thereon. In particular a naked die as example for an embedded electronic component, can be conveniently embedded, thanks to its small thickness, into a thin plate such as a printed circuit board.

According to another embodiment of the invention the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layers with several electrically insulating layers, for instance by applying pressure, if desired accompanied by the supply of thermal energy. As preferred materials for PCB technology, the electrically conductive layers are made of copper, whereas the electrically insulating layers may comprise resin and/or glass fibers, so-called prepreg or FR4 material. The various electrically conductive layers may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" in particular can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

According to another embodiment of the invention the component carrier is a laminate-type component carrier. In such an embodiment, the component carrier is a compound of multiple layer structures which are stacked and connected together by applying a pressing force, if desired accompanied by heat.

It has to be noted that embodiments of the invention have been described with reference to different subject matters. In particular, some embodiments have been described with reference to method type claims whereas other embodiments have been described with reference to apparatus type claims. However, a person skilled in the art will gather from the above and the following description that, unless other notified, in addition to any combination of features belonging to one type of subject matter also any combination between features relating to different subject matters, in particular between features of the method type claims and features of the apparatus type claims is considered as to be disclosed with this document.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION OF ILLUSTRATED EMBODIMENTS

The illustration in the drawing is schematically presented. In order to avoid unnecessary repetitions elements or features which have already been elucidated with respect to a previously described embodiment are not elucidated again at a later position of the description.

Further, spatially relative terms, such as "front" and "back", "above" and "below", "left" and "right", et cetera are used to describe an element's relationship to another element or elements as illustrated in the figures. Thus, the spatially relative terms may apply to orientations in use which differ from the orientation depicted in the figures. Obviously, all such spatially relative terms refer to the orientation shown in the figures only for ease of description and are not necessarily limiting as an apparatus according to an embodiment of the invention can assume orientations different than those illustrated in the figures when in use.

Figure 1:
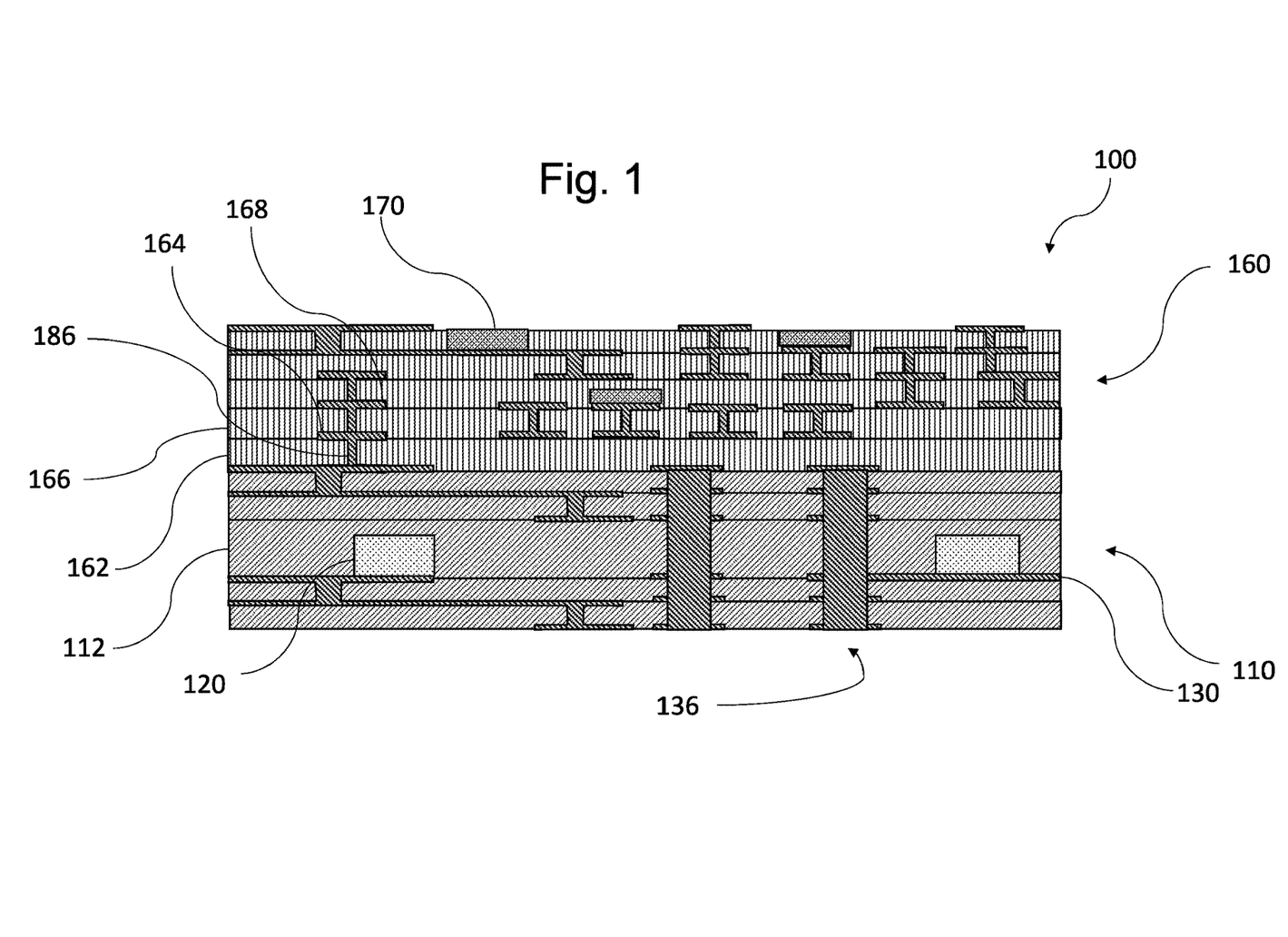
FIG. 1 shows an embodiment of a component carrier according to the invention.

FIG. 1 shows an embodiment of a component carrier 100 according to the invention. The component carrier 100 comprises a first layer structure 110 having a plurality of electrically insulating layers 112 and electrically conductive layers 130. A second layer structure 160 is present on the first layer structure 110 wherein the second layer structure 160 comprises a plurality of layers, among which there is at least a first layer 162 and a second layer 164.

The first layer 162 of the second layer structure 160 is placed on the first layer structure 110 and the second layer 164 of the second layer structure 160 is then placed on the first layer 162 of the second layer structure 160. The first layer 162 of the second layer structure 160 present on the first layer structure 110 is an electrically insulating layer. The second layer 164 of the second layer structure 160 placed on the first layer 162 of the second layer structure 160 is an electrically conductive layer. In an alternative embodiment, not shown here, the first layer 162 of the second layer structure 160 is an electrically conductive layer, while the second layer 164 of the second layer structure 160 is an electrically insulating layer. In the embodiment shown in FIG. 1, further layers, such as a third layer 166 and a fourth layer 168, which are an electrically conductive and an electrically insulating layer, respectively, form part of the second layer structure 160.

The second layer structure 160 is placed on the first layer structure 110 so as to fully cover the upper surface of the first layer structure 110. This means that for instance the first layer 162 of the second layer structure 160 has essentially the same size as the upper surface of the first layer structure 100. The embodiment described here contrasts an embodiment not shown where the first layer structure 110 comprises a recess or a cavity in which the second layer structure 160 is embedded in.

The first layer structure 110 is a high-density interconnect structure, and the second layer structure 160 is an ultra-high-density interconnect structure. This is reflected for instance by the first layer structure 110 having a first density of electrically conductive elements 130, 120, 136 and the second layer structure 160 having a second density of electrically conductive elements 164, 168, 170, 186, wherein the second density of electrically conductive elements is greater than the first density of electrically conductive elements.

Further, the plurality of electrically insulating layers 112 of the first layer structure 110 are of a different material than the plurality of insulating layer of the second layer structure 162, 166. While the electrically insulating layers 112 of the first layer structure 110 comprise glass-fibers and are preferably made of an FR4 material, the electrically insulating layers 162, 166 of the second layer structure 160 are made of a glass-particles containing resin material for taking into account the different requirements of the second layer structure 160 as an ultra-high-density interconnect relative to the first layer structure as a high-density interconnect.

The first layer 162 of the second layer structure 160 as an insulating layer has a thickness of not more 35 micrometer, preferably of not more than 30 micrometer while the second layer 164 of the second layer structure 160 as an electrically conductive layer has a thickness of not more 20 micrometer, preferably of not more than 15 micrometer. Electrical connection vias 186 within the second layer structure 160 are usually much thinner and present in a much higher density than electrical connection vias 136 of the first layer structure 110. Active components 170 are embedded in the second layer structure 160 while passive components 120 are embedded in the first layer structure 110. Advantageously, no additional silicon substrate is required since the active components are integrated into the second layer structure.

Figure 2:
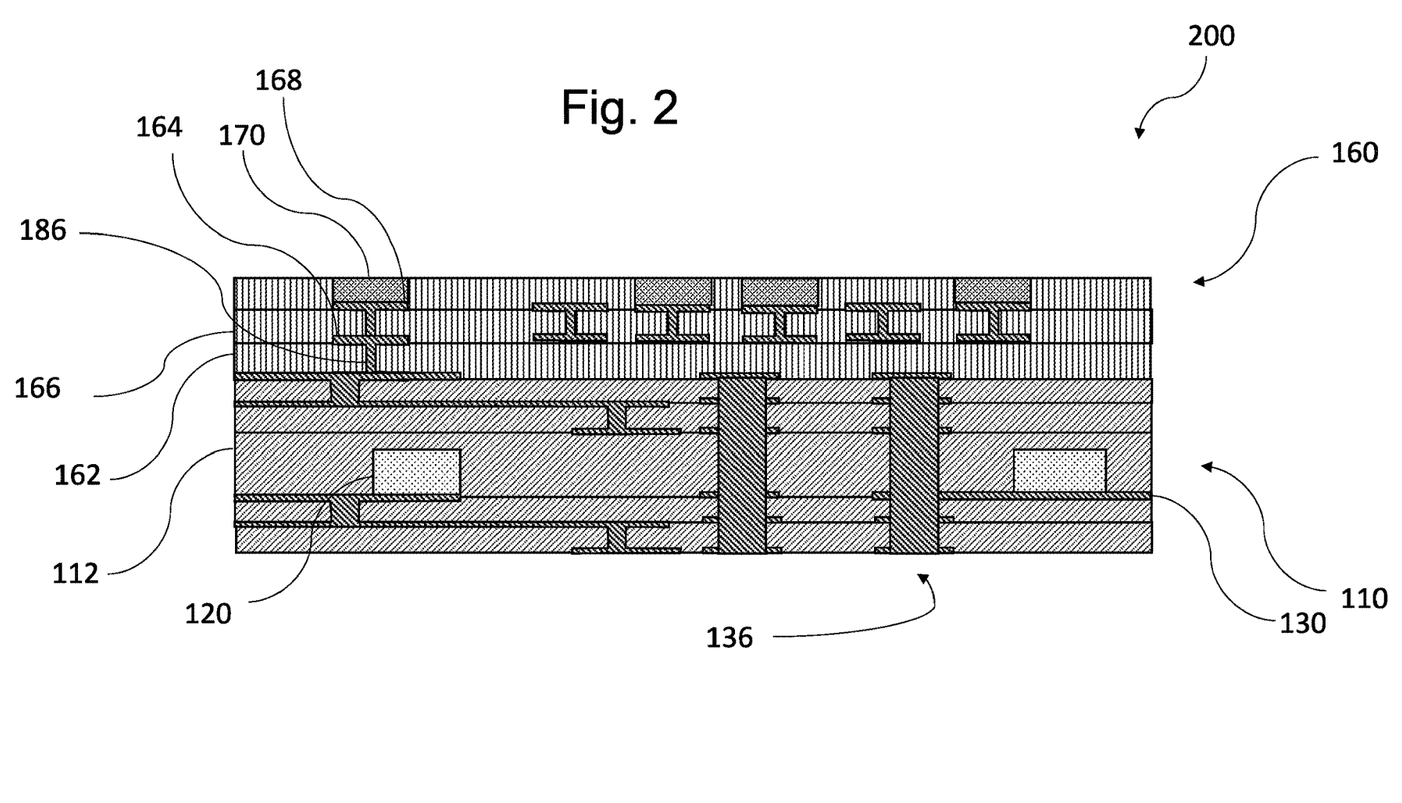
FIG. 2 shows another embodiment of a component carrier according to the invention.

FIG. 2 shows another embodiment of a component carrier 200 according to the invention. In the embodiment shown in FIG. 2 the second layer structure 160 is thinner than the first layer structure 110. The reference signs used in FIG. 1 have also been used for FIG. 2.

Figure 3A:
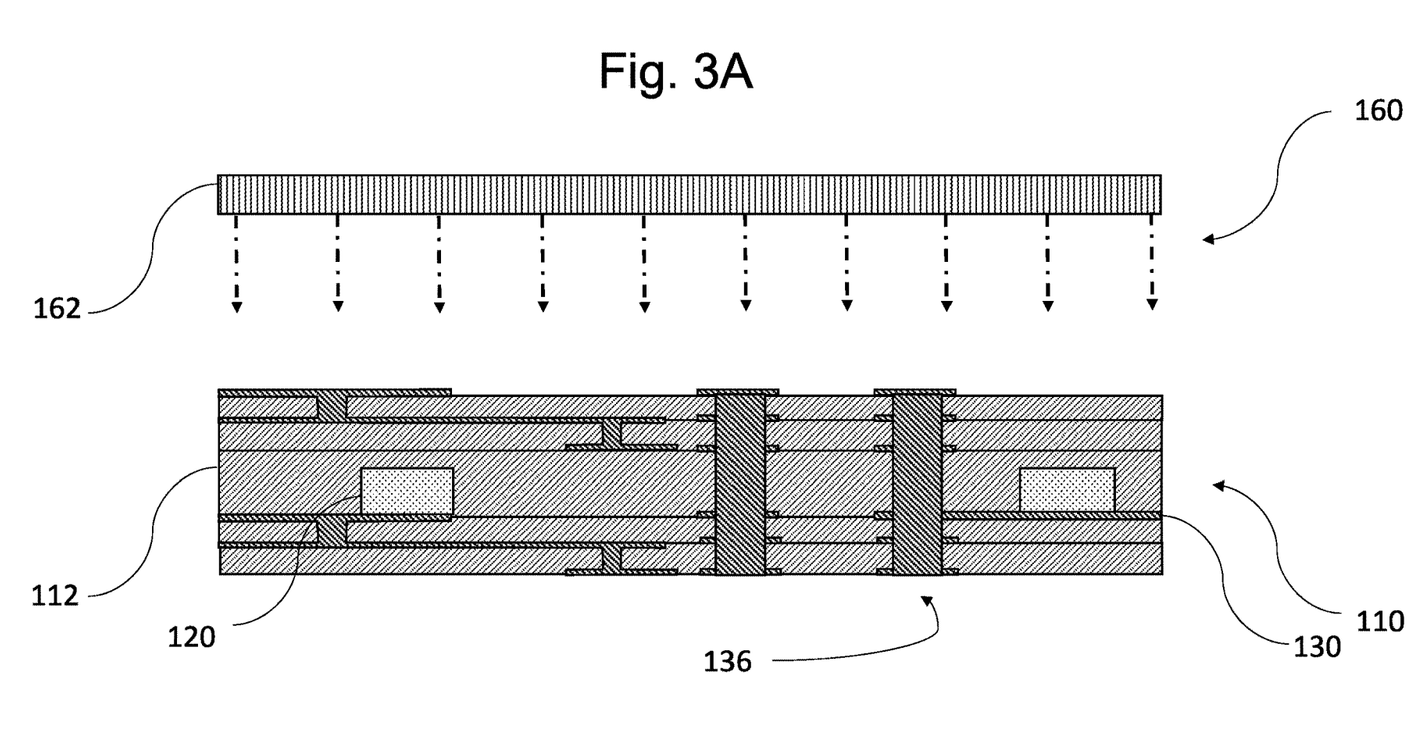
FIGS. 3A, 3B and 3C illustrates a method for manufacturing of a component carrier according to the invention.
Figure 3B:
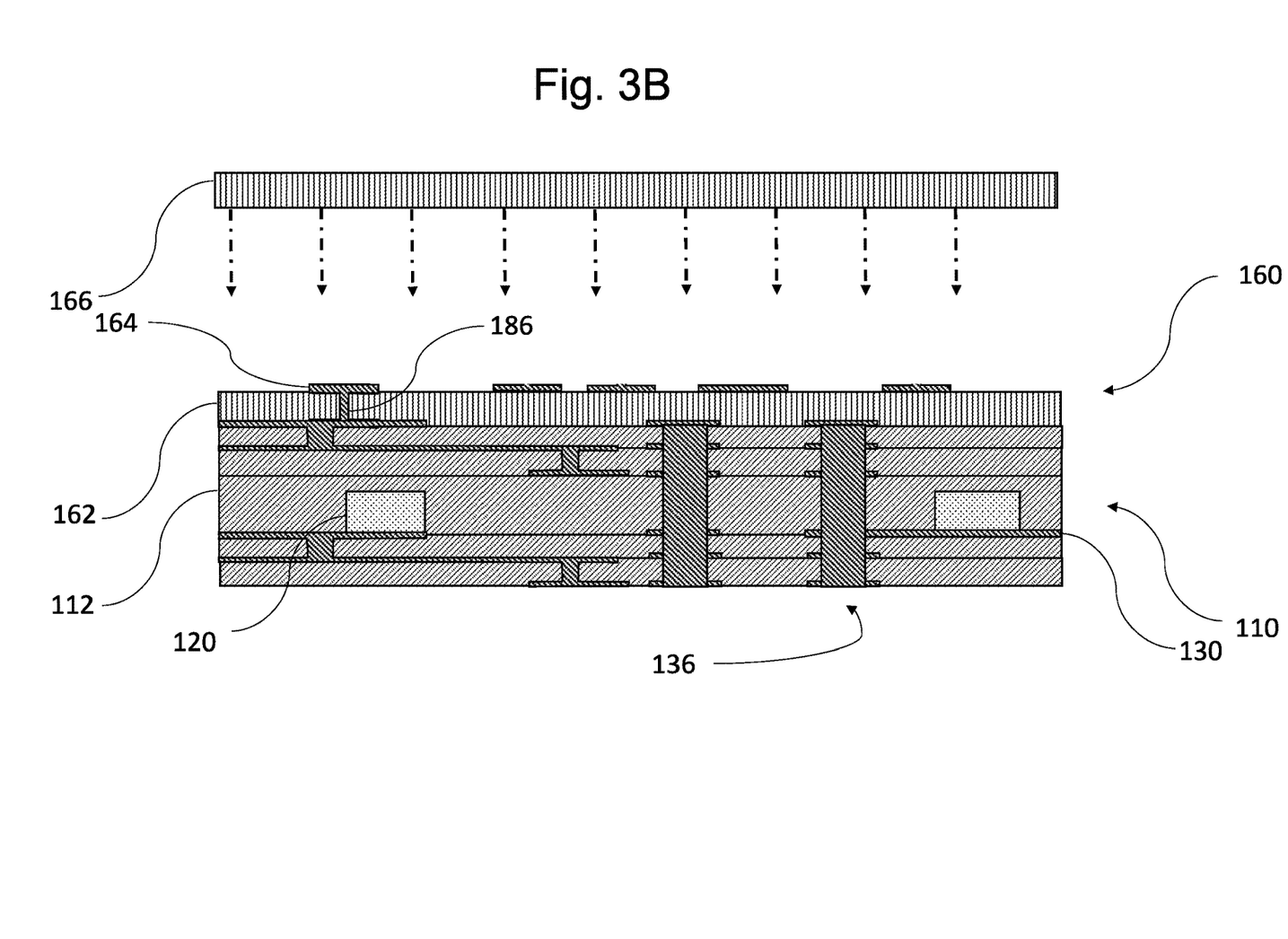
Figure 3C:
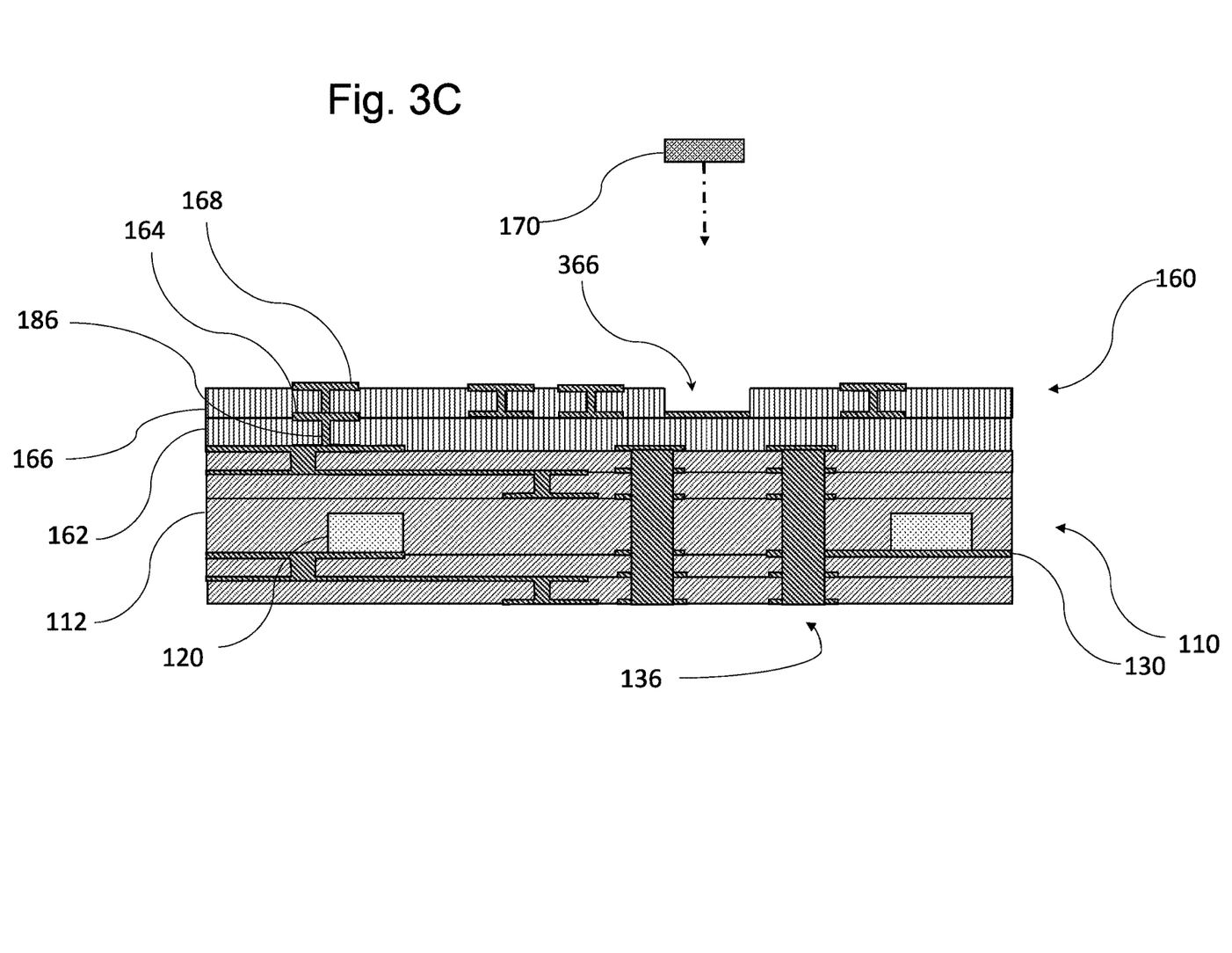

FIGS. 3A-3C illustrate a method for manufacturing of a component carrier according to the invention. The reference signs used in FIG. 1 have also been used for FIGS. 3A-3C. FIG. 3A illustrates the providing of a first layer structure 110 having a plurality of electrically insulating layers 112 and electrically conductive layers 130 on which a second layer structure 160 is formed. The forming of the second layer structure 160 on the first layer structure 110 comprises firstly the forming of a first layer 162 of the second layer structure 160 on the first layer structure 110.

By a curing step the first layer of the second layer 162 structure is directly bound to the exposed electrically insulating layer of the first layer structure 112, thereby forming an integral connection between the first layer structure 110 and the second layer structure 160.

As illustrated in FIG. 3B, a second layer 164 of the second layer structure 160 is formed as a conductive layer on the first layer 162 of the second layer structure 160.

At least one electrical connection via 186 between the second layer 164 of the second layer structure 160 and an electrically conductive layer of the first layer structure 130 is formed.

As shown in FIG. 3C, this is followed by the formation of a third layer of the second layer structure 166, which again is an insulating layer. A cavity 366 is formed in the third layer of the second layer structure 166, into which an active component 170, for instance a die can be embedded. Thereby, the insulating material of the third layer of the second layer structure 166 itself can be considered as a package encapsulating the die which renders the provision of an additional package obsolete thereby making the component carrier more compact and its manufacture more efficient since the additional step of package formation can be spared. A fourth layer of the second layer structure 168 which is another conductive layer is formed and additional electrical connection vias are incorporated.

Figure 4:
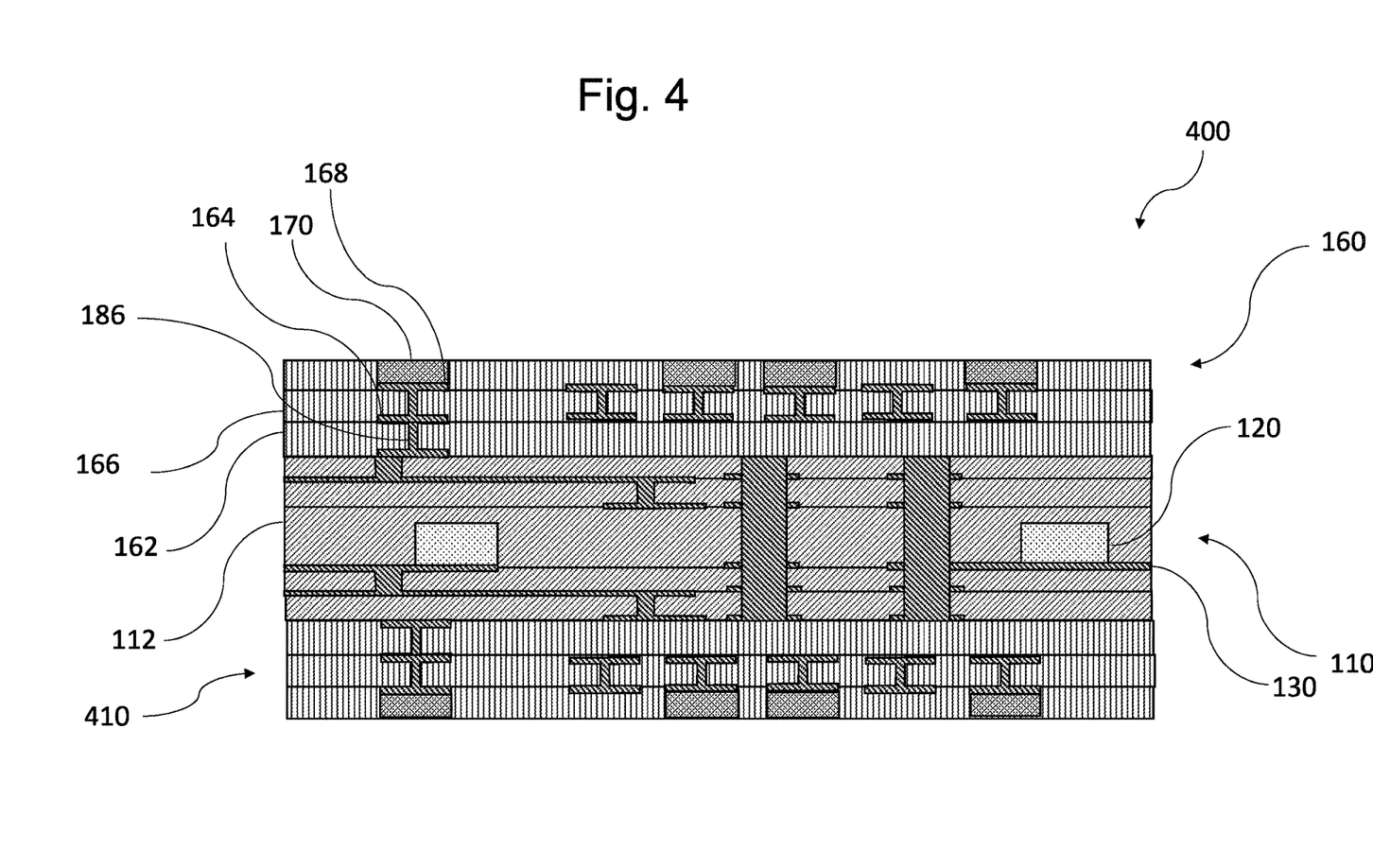
FIG. 4 shows another embodiment of a component carrier according to the invention.

FIG. 4 shows another embodiment of a component carrier according to the invention. The reference signs used in FIG. 1 have also been used in FIG. 4.

The component carrier 400 comprises a first layer structure 110 having a plurality of electrically insulating layers 112 and electrically conductive layers 130. The second layer structure 160 is placed on one main surface of the first layer structure 110. The component carrier 400 has essentially the same features as the component carrier as presented in FIG. 1 above, as reflected by the use of the same reference signs as in FIG. 1. Additionally, a third layer structure 410 is placed on the main surface of the first layer structure 110 which is opposite to the main surface of the first layer structure 110 which the second layer structure 160 is placed on. Each of a second density of electrically conductive elements of the second layer structure 160 and a third density of electrically conductive elements of the third layer structure 410 is greater than the first density of electrically conductive elements of the first layer structure.

It should be noted that the term "comprising" does not exclude other elements or steps and the article "a" or "an" does not exclude a plurality. Also, elements described in association with different embodiments may be combined. It should also be noted that reference signs in the claims shall not be construed as limiting the scope of the claims.

The invention claimed is:

1. A component carrier, comprising:
   a first layer structure having at least one electrically insulating layer and at least one electrically conductive layer;
   a first component, in particular a passive component, embedded in the first layer structure; and
   a second layer structure on the first layer structure,
   wherein the second layer structure comprises at least a first layer and a second layer,
   wherein the first layer structure has a first density of electrically conductive elements,
   wherein the second layer structure has a second density of electrically conductive elements,
   wherein the second density of electrically conductive elements is greater than the first density of electrically conductive elements,
   wherein the first layer of the second layer structure is formed on the first layer structure; and
   wherein the second layer of the second layer structure is formed on the first layer of the second layer structure;
   wherein at least one heat dissipation pathway for dissipating heat from the second layer structure to the first layer structure is formed.

2. The component carrier according to claim 1, wherein the second layer structure has a mean line-to-line distance of electronic circuitry of not more than 20 micrometer.

3. The component carrier according to claim 1, wherein the first density of electrically conductive elements and the second density of electrically conductive elements is defined by the number of electric components per unit of volume.

4. The component carrier according to claim 1, wherein the first layer of the second layer structure formed on the first layer structure is an electrically insulating layer, wherein in particular at least one of the first layer of the second layer structure and the second layer of the second layer structure are initially provided as an uncured electrically insulating material,
   wherein in particular the second layer structure is formed on the first layer structure so as to fully cover the upper surface of the first layer structure.

5. The component carrier according to claim 1, wherein at least one of the first layer of the second layer structure and the second layer of the second layer structure comprises particles,
   wherein at least one of the at least one electrically insulating layers of the first layer structure comprise in particular glass-fibers.

6. The component carrier according to claim 1, wherein at least one electrical connection via between at least one of the first layer of the second layer structure and the second layer of the second layer structure and at least one of the electrically conductive layers of the first layer structure is formed.

7. The component carrier according to claim 1, wherein a cavity is formed in the second layer structure; and
   a second component, in particular an active component, is provided in the cavity;
   wherein in particular the first component is embedded in the second most upper layer of the first layer structure and the second component is embedded in the first layer of the second layer structure.

8. The component carrier according to claim 1, wherein the first layer structure has a first thickness;
   wherein the second layer structure formed on the first layer structure has a second thickness, and
   wherein the first thickness is larger than the second thickness.

9. The component carrier according to claim 1, further comprising:
   another component being an electronic component at least mounted on and embedded in at least one of an electrically insulating layer of the first layer structure and at least one electrically conductive layer of the first layer structure.

* * * * *